(12) United States Patent
Mohammed et al.

(10) Patent No.: US 8,013,429 B2
(45) Date of Patent: Sep. 6, 2011

(54) AIR CAVITY PACKAGE WITH COPPER HEAT SINK AND CERAMIC WINDOW FRAME

(75) Inventors: Anwar A. Mohammed, San Jose, CA (US); Soon Ing Chew, Milpitas, CA (US); Alexander Komposch, Morgan Hill, CA (US); Christian Andrada, Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 50 days.

(21) Appl. No.: 12/502,440

(22) Filed: Jul. 14, 2009

(65) Prior Publication Data
US 2011/0012254 A1    Jan. 20, 2011

(51) Int. Cl.
*H01L 23/495*    (2006.01)
(52) U.S. Cl. .................. 257/675; 257/E23.051
(58) Field of Classification Search .......... 257/675, 257/680, 706, 688, E23.051
See application file for complete search history.

(56) References Cited

U.S. PATENT DOCUMENTS

| | | | |
|---|---|---|---|
| 5,757,070 A * | 5/1998 | Fritz | 257/675 |
| 5,804,870 A * | 9/1998 | Burns | 257/666 |
| 6,285,075 B1 * | 9/2001 | Combs et al. | 257/675 |
| 6,511,866 B1 | 1/2003 | Bregante et al. | |
| 7,015,072 B2 * | 3/2006 | Combs et al. | 438/122 |
| 2008/0272475 A1 | 11/2008 | Dijkstra et al. | |

OTHER PUBLICATIONS

Mohammed et al., "High Power Ceramic on Copper Package," co-pending U.S. Appl. No. 12/436,652, filed May 6, 2009.

* cited by examiner

*Primary Examiner* — Jenny L. Wagner
(74) *Attorney, Agent, or Firm* — Coats & Bennett, P.L.L.C.

(57) ABSTRACT

An air cavity package is manufactured by attaching a die to a surface of a copper heat sink, dispensing a bead of epoxy around a periphery of the heat sink surface after the die is attached to the copper heat sink so that the bead of epoxy generally surrounds the die and placing a ceramic window frame on the bead of epoxy. The epoxy is cured to attach a bottom surface of the ceramic window frame to the copper heat sink.

15 Claims, 4 Drawing Sheets

AIR CAVITY PACKAGE WITH COPPER HEAT SINK AND CERAMIC WINDOW FRAME

BACKGROUND

Air cavity packages typically include one or more semiconductor die attached to a base plate and an insulative window frame surrounding the die. A lid is placed over the window frame, sealing the die in a cavity of air. Air cavity packages are widely used to house high frequency devices such as radio-frequency or RF die. Packaging a high frequency semiconductor chip in an envelope of encapsulated air improves the high frequency properties of the die and the corresponding electrical leads, as opposed to being encapsulated in a molding compound which has a higher dielectric constant than air.

Some conventional air cavity packages use window frames made of ceramic, but the ceramic window frame is typically attached prior to the die attach process. Ceramic window frames are typically attached to a conductive metal base plate using a high temperature brazing process (e.g. 850 C). Such high processing temperatures preclude the use of copper base plates with ceramic window frames because the CTE (coefficient of thermal expansion) mismatch between copper and ceramic materials induces cracks in the ceramic window frame at brazing temperatures. As such, the base plate is typically made of CuMOCu or CuW when a ceramic window frame is used. However, both CuMOCu (260 W/mK) and CuW (180 W/mK) have a significantly lower thermal conductivity than pure copper (394 W/mK), reducing the overall thermal performance of the package.

Epoxies and other pliant materials can be used to attach a ceramic window frame to a metal base plate prior to die attach. However, pliant materials such as epoxies can be damaged during subsequent high temperature die attach processes. Some conventional air cavity assembly techniques involve attaching the window frame to the base plate after die attach, but the window frame is made of plastic, e.g. as disclosed in U.S. Pat. No. 6,511,866. A window frame made of plastic has a much lower thermal conductivity than a ceramic window frame, limiting the use of air cavity packages having plastic window frames to lower power applications where heat dissipation is less of a concern. Also, the materials and process which can be used for attaching a plastic window frame to a base plate are limited because of the low melting point of conventional plastic window frames.

SUMMARY

According to an embodiment of a method for manufacturing an air cavity package, a die is attached to a surface of a copper heat sink and a bead of epoxy is dispensed around a periphery of the heat sink surface after the die is attached to the copper heat sink so that the bead of epoxy generally surrounds the die. A ceramic window frame is placed on the bead of epoxy and the epoxy cured to attach a bottom surface of the ceramic window frame to the copper heat sink.

According to another embodiment of a method for manufacturing an air cavity package, a die is attached to a surface of a copper heat sink having a thermal conductivity of at least 350 W/mK. A bead of epoxy is dispensed around a periphery of the heat sink surface after the die is attached to the copper heat sink so that the bead of epoxy generally surrounds the die. A ceramic window frame is placed on the bead of epoxy and the epoxy cured at a temperature above 200° C., but less than about 265° C. to attach a bottom surface of the ceramic window frame to the copper heat sink.

According to yet another embodiment of a method for manufacturing an air cavity package, a plurality of die are attached to a surface of a copper heat sink and a bead of epoxy is dispensed around a periphery of the heat sink surface after the plurality of die are attached to the copper heat sink so that the bead of epoxy generally surrounds the plurality of die. A ceramic window frame is placed on the bead of epoxy and a force applied to the ceramic window frame suitable to force a portion of the epoxy from under a bottom surface of the ceramic window frame to along an outer sidewall of the ceramic window frame facing away from the plurality of die. The epoxy is cured to attach the bottom surface of the ceramic window frame to the copper heat sink and form an epoxy-based fillet along the outer sidewall of the ceramic window frame.

According to an embodiment of an air cavity package, the package includes a copper heat sink, a plurality of die attached to a surface of the copper heat sink having a thermal conductivity of at least 350 W/mK and a ceramic window frame having a bottom surface attached to a periphery of the heat sink surface via a cured epoxy. The ceramic window frame generally surrounds the plurality of die and the cured epoxy has a cure temperature above 200° C., but less than about 265° C.

According to an embodiment of an air cavity package, the package includes a copper heat sink, a die attached to a surface of the copper heat sink having a thermal conductivity of at least 350 W/mK and a ceramic window frame. The ceramic window frame has a bottom surface attached to a periphery of the heat sink surface via a cured epoxy and generally surrounds the die. The package further includes a fillet formed from a portion of the cured epoxy disposed along an outer sidewall of the ceramic window frame facing away from the die.

Those skilled in the art will recognize additional features and advantages upon reading the following detailed description, and upon viewing the accompanying drawings.

DETAILED DESCRIPTION

Figure 1:
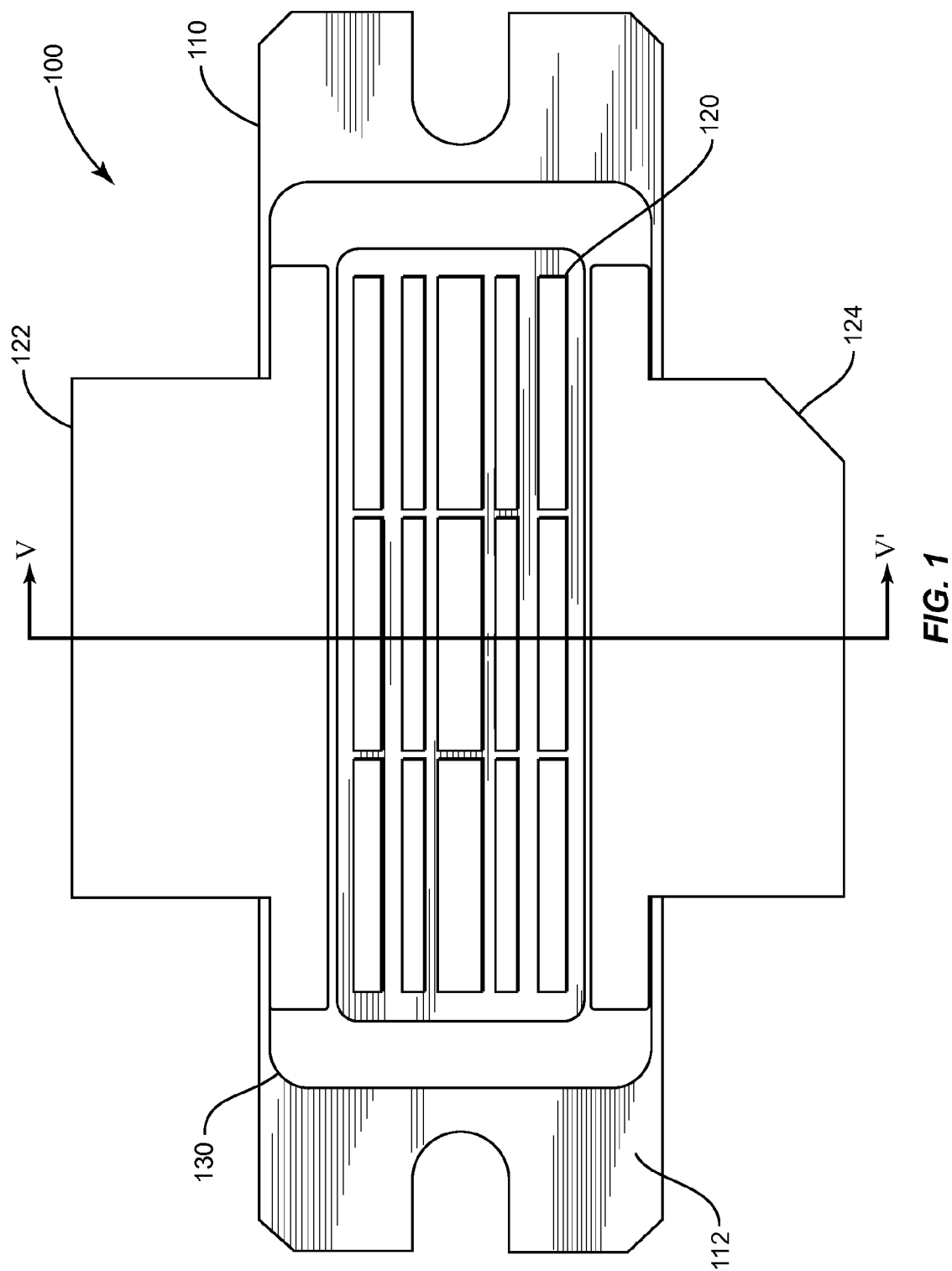
FIG. 1 illustrates a plan view of an embodiment of an air cavity package including one or more die attached to a copper heat sink and generally surrounded by a ceramic window frame.

FIG. 1 illustrates a plan view of an embodiment of an air cavity package 100 prior to lid placement. The air cavity package 100 includes a copper heat sink 110, one or more die 120 attached to a surface 112 of the copper heat sink 110 and a ceramic window frame 130 having a bottom surface attached to a periphery of the heat sink 110 surface via a cured epoxy (out of view in FIG. 1). The ceramic window frame 130 generally surrounds each die 120 and has conductive leads 122, 124 disposed on a top surface for making electrical contact to the die 120. In one embodiment, some of the die 120 are LDMOS (laterally diffused metal oxide semiconductor) die and other ones of the die 120 include passive devices such as capacitors. Broadly, any number of desired die 120 can be housed within the package 100 and generally surrounded by the ceramic window frame 130. The ceramic window frame 130 is attached to the copper heat sink 110 using an epoxy after the die 120 are attached to the heat sink 110. Embodiments for manufacturing the air cavity package 100 are described next.

Figure 2:
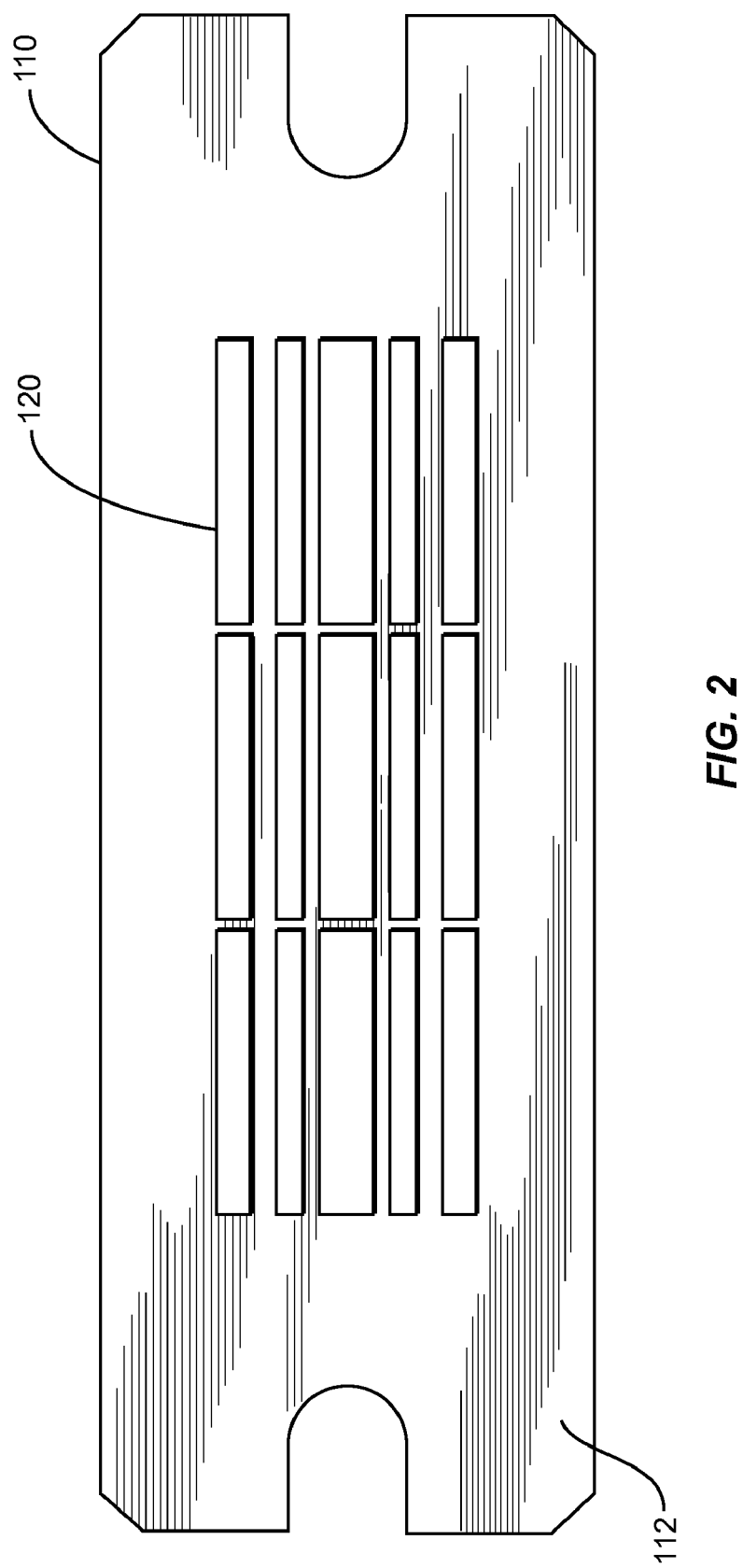
FIG. 2 illustrates a plan view of the air cavity package of FIG. 1 after each die is attached to the copper heat sink.

FIG. 2 shows a plan view of the copper heat sink 110 after each die 120 is attached to the top surface 112 of the copper heat sink 110. In one embodiment, the copper heat sink 110 contains enough copper to provide a thermal conductivity of at least 350 W/mK. Thus, the copper heat sink 110 can be made from a copper alloy such as CU 194, but still contain enough copper to provide sufficient heat transfer. According to an embodiment, the copper heat sink 110 is plated with a Ni/Pd/Au metallization. In each case, the die 120 can be epoxied, soldered or brazed to the top surface 112 of the copper heat sink 110.

Figure 3:
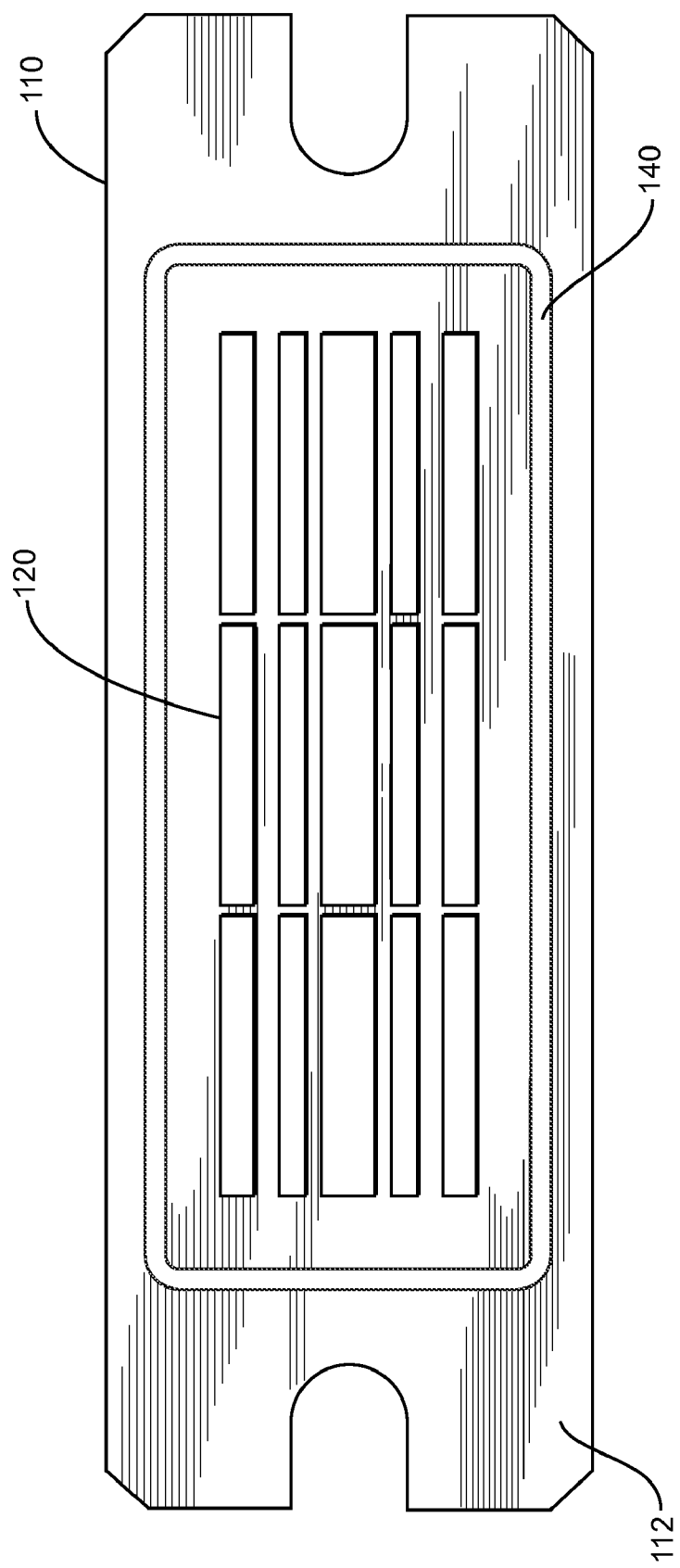
FIG. 3 illustrates a plan view of the air cavity package of FIG. 1 after a bead of epoxy is dispended around a periphery of the heat sink to generally surround the die.

FIG. 3 shows a plan view of the copper heat sink 110 after a bead 140 of epoxy is dispensed around the periphery of the heat sink surface 112. The bead 140 of epoxy is dispensed on the copper heat sink 110 after the die attach process, e.g. using a needle. The bead 140 of epoxy generally surrounds the die 120 and is subsequently cured later to attach the ceramic window frame 130 to the heat sink 110 as described later herein. In one embodiment, the epoxy comprises silica. The width and thickness of the epoxy bead 140 can be selected as desired. In one embodiment, a relatively small needle is used to dispense about a 30 mil wide and about 15 mil thick bead 140 of epoxy around the periphery of the upper heat sink surface 112. The ceramic window frame 130 is then aligned and placed on the bead 140 of epoxy.

Figure 4:
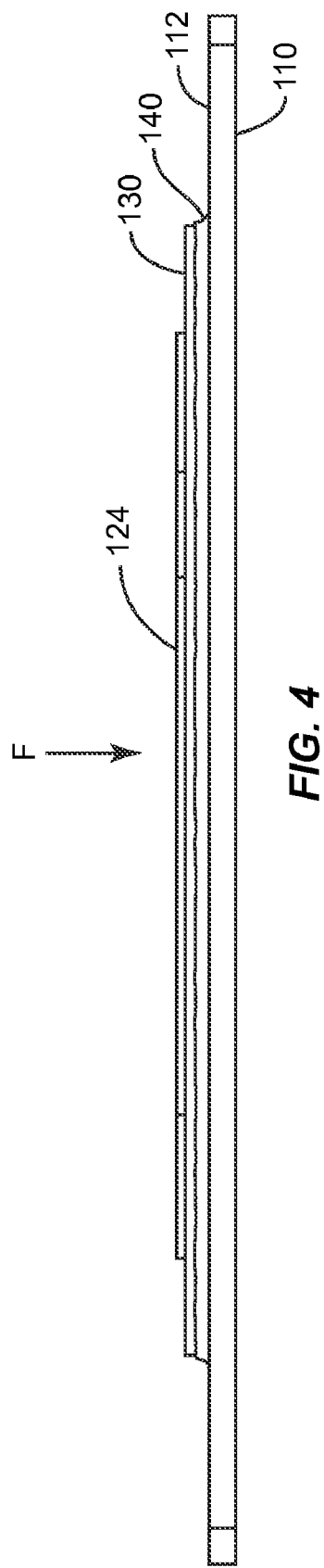
FIG. 4 illustrates a side view of the air cavity package of FIG. 1 after the ceramic window frame is placed on the bead of epoxy.

FIG. 4 shows a side perspective view of the copper heat sink 110 after the ceramic window frame 130 is placed on the bead 140 of epoxy. In one embodiment, the ceramic window frame 130 comprises approximately 95% alumina. However, other types of ceramic material can be used for the window frame 130. A downward force (F) can be applied to the ceramic window frame 130 and is suitable to force a portion of the uncured epoxy from under the bottom surface of the ceramic window frame 130 to along an outer sidewall of the ceramic window frame 130 facing away from the die 120. Enough force can be applied so that a further portion of the uncured epoxy is forced from under the bottom surface of the ceramic window frame 130 to along an inner sidewall of the ceramic window frame 130 facing toward the die 120. According to one embodiment, about 350 grams of force is applied to the ceramic window frame 130 to force some of the uncured epoxy to cover the outer and/or inner sidewalls of the ceramic window frame 130. The portion of the epoxy forced from under the bottom surface of the ceramic window frame 130 forms a fillet along the outer and/or inner sidewalls of the ceramic window frame 130 when the epoxy is subsequently cured.

Figure 5:
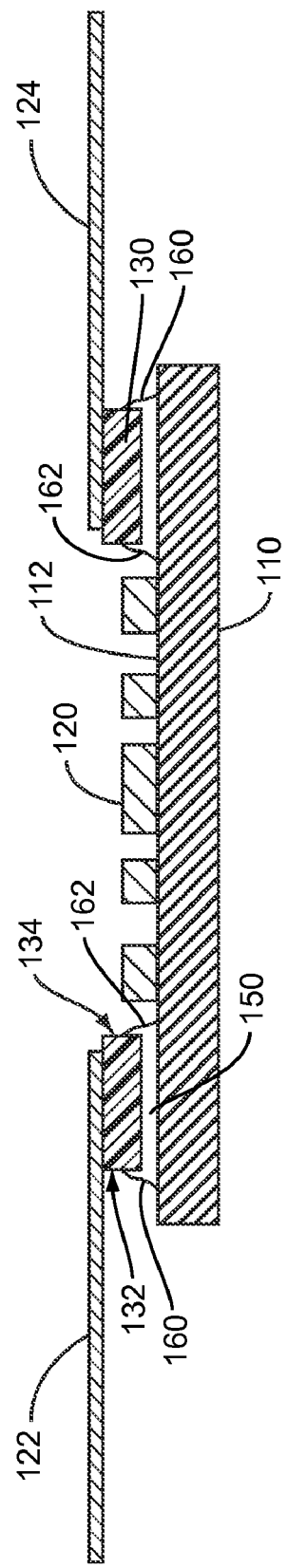
FIG. 5 illustrates a cross-sectional view of the air cavity package of FIG. 1 after the epoxy is cured.

FIG. 5 illustrates a cross-section of the air cavity package taken along the line labeled V-V' in FIG. 1 after the epoxy is cured. Using an epoxy to attach the ceramic window frame 130 to the copper heat sink 110 enhances the thermal performance of the airy cavity package 100 while reducing bowing of the heat sink 110 because epoxy cure temperatures are relatively low compared to soldering and brazing temperatures. According to one embodiment, the epoxy has a cure temperature above 200° C., but less than about 265° C. For example, the epoxy can be a polyimide. This way, epoxies which could not normally be used with a plastic window frame can be used for adhering the ceramic window frame 130 to the heat sink 110 because the ceramic window frame 130 can withstand high cure temperatures. Epoxies having a lower cure temperature can also be used, e.g. epoxies having a cure temperature between 125° C. and 200° C. In each case, curing the epoxy attaches the bottom surface of the ceramic window frame 130 to the copper heat sink 110. According to an embodiment, the cured epoxy 150 has a thickness of about 4 to 8 mils in a region under the bottom surface of the ceramic window frame 130.

FIG. 5 shows an epoxy-based fillet 160, 162 formed along both the outer and inner sidewalls 132, 134 of the ceramic window frame 130. Alternatively, an epoxy-based fillet 160 may be formed against the outer sidewall 132 of the ceramic window frame 130, but not the inner sidewall 134. In either case, the epoxy-based fillets 160, 162 are formed by applying a sufficient force to the ceramic window frame 130 prior to epoxy curing as previously describe herein. Each epoxy-based fillet 160, 162 provides a concave easing of the corner formed between the respective sidewall 132, 134 of the ceramic window frame 130 and the upper surface 112 of the heat sink 110. Using a portion of the epoxy to form a rounded corner between the exterior and/or interior sidewalls 132, 134 of the ceramic window frame 130 and the upper heat sink surface 112 enhances the quality of the air cavity of the package 100 by improving the seal formed between the ceramic window frame 130 and the heat sink 110 after epoxy curing. In one embodiment, the outer epoxy-based fillet 160 extends over at least 25% of the height of the outer sidewall 132 of the ceramic window frame 130 as measured from the upper heat sink surface 112. In some embodiments, the outer epoxy-based fillet 160 extends up to about 50% of the height of the outer sidewall 132 of the ceramic window frame 130.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An air cavity package, comprising:
   a copper heat sink having a thermal conductivity of at least 350 W/mK;
   a die attached to a surface of the copper heat sink;
   a ceramic window frame having a bottom surface attached to a periphery of the heat sink surface via a cured epoxy, the ceramic window frame generally surrounding the die; and a fillet formed from a portion of the cured epoxy disposed along an outer sidewall of the ceramic window frame facing away from the die, the fillet extending over at least 25% of the height of the outer sidewall of the ceramic window frame as measured from the heat sink surface.

2. The air cavity package of claim 1, wherein the cured epoxy has a thickness that is equal to or less than 8 mils in a region under the bottom surface of the ceramic window frame.

3. The air cavity package of claim 1, wherein the heat sink is plated with a metal that comprises Au.

4. The air cavity package of claim 1, further comprising an additional fillet formed from a portion of the cured epoxy disposed along an inner sidewall of the ceramic window frame facing toward the die.

5. The air cavity package of claim 1, wherein the cured epoxy has a cure temperature above 125° C., but less than about 265° C.

6. The air cavity package of claim 5, wherein the cured epoxy has a cure temperature above 200° C., but less than about 265° C.

7. The air cavity package of claim 1, wherein the ceramic window frame comprises 95% alumina.

8. The air cavity package of claim 1, wherein the copper heat sink is plated with a Ni/Pd/Au metallization.

9. A package, comprising:
a heat sink made of a copper alloy having a thermal conductivity of at least 350 W/mK;
a die attached to a surface of the heat sink;
a ceramic window frame having a bottom surface attached to a periphery of the heat sink surface via a cured epoxy, the ceramic window frame generally surrounding the die; and
a fillet formed from a portion of the cured epoxy disposed along an outer sidewall of the ceramic window frame facing away from the die, the fillet extending over at least 25% of the height of the outer sidewall of the ceramic window frame as measured from the heat sink surface.

10. The package of claim 9, wherein the cured epoxy has a cure temperature above 125° C., but less than about 265° C.

11. The package of claim 10, wherein the cured epoxy has a cure temperature above 200° C., but less than about 265° C.

12. The package of claim 9, wherein the heat sink is plated with a Ni/Pd/Au metallization.

13. The package of claim 9, further comprising an additional fillet formed from a portion of the cured epoxy disposed along an inner sidewall of the ceramic window frame facing toward the die.

14. The package of claim 9, wherein the fillet extends up to about 50% of the height of the outer sidewall of the ceramic window frame.

15. The package of claim 9, wherein the ceramic window frame comprises 95% alumina.

* * * * *